United States Patent [19]
Cook

[11] Patent Number: 4,597,823
[45] Date of Patent: Jul. 1, 1986

[54] RAPID LPE CRYSTAL GROWTH

[76] Inventor: Melvin S. Cook, P.O. Box 38, Saddle River, N.J. 07458

[21] Appl. No.: 531,230

[22] Filed: Sep. 12, 1983

[51] Int. Cl.$^4$ ............................................. C30B 19/02
[52] U.S. Cl. ................................................. 156/622
[58] Field of Search ............... 427/86; 148/171; 156/622, 608, DIG. 97, 624, 623 R, DIG. 70, 621; 422/253

[56] References Cited

U.S. PATENT DOCUMENTS

| | | | |
|---|---|---|---|
| Re. 28,140 | 8/1974 | Bergh et al. | 156/624 |
| 3,249,404 | 5/1966 | Bennett | 156/608 |
| 3,880,680 | 4/1975 | Weyrich et al. | 148/171 |
| 3,889,635 | 6/1975 | Aengenheister | 148/171 |
| 3,990,392 | 11/1976 | Andre | 156/622 |
| 4,052,252 | 10/1977 | Lockwood | 156/622 |
| 4,315,796 | 2/1982 | Nishizawa | 156/622 |
| 4,319,953 | 3/1982 | Grabmaier | 156/622 |
| 4,357,200 | 11/1982 | Grabmaier | 427/86 X |

FOREIGN PATENT DOCUMENTS 2074469  11/1981  United Kingdom ............... 156/622

Primary Examiner—Hiram H. Bernstein
Attorney, Agent, or Firm—Gottlieb, Rackman & Reisman

[57] ABSTRACT

An apparatus and a method for growth of material on substrates. A substrate at temperature $T_2$ is placed with a surface in contact with solution in streamline flow through a narrow channel. The solution enters the channel with a temperature, $T_1$, which is above its saturation temperature, $T_s$, $T_2$ is below $T_s$, so material will deposit on the substrate surface. The flow of solution is maintained high enough to avoid the onset of constitutional supercooling.

2 Claims, 9 Drawing Figures

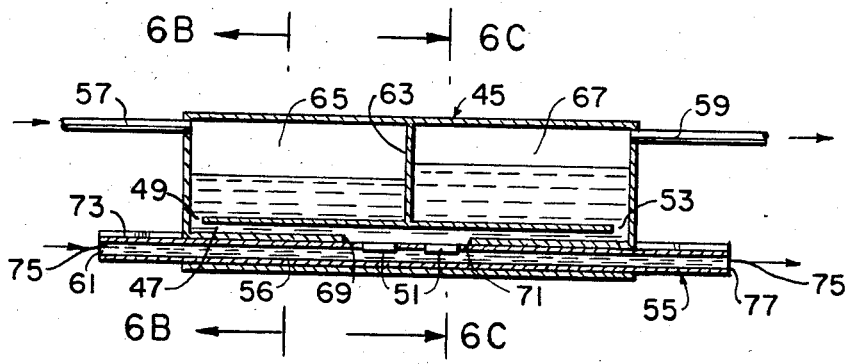
*FIG. 6A*
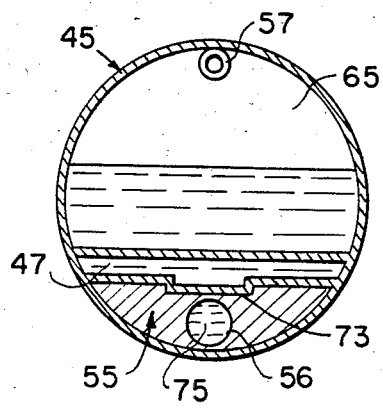 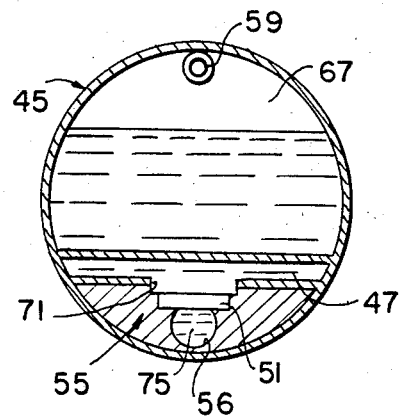
*FIG. 6B*  *FIG. 6C*

RAPID LPE CRYSTAL GROWTH

DESCRIPTION

This invention relates to rapid liquid phase epitaxy (LPE) crystal growth from solutions in streamline flow across substrates in narrow channels. It can be used, for example, to grow crystalline epitaxial layers of semiconductors for use in the fabrication of electronic circuits and solar cells.

The crystal quality of epitaxial layers grown from solution is, in some cases, superior to that which can be produced using such other techniques as vapor phase epitaxy or molecular beam epitaxy. Nevertheless, in spite of the relative simplicity of LPE equipment, its use has been inhibited by low productivity. High growth rates are of interest in LPE, but they have been typically accompanied by crystal degradation resulting from constitutional supercooling or loss of surface smoothness as a result of free convective currents in the solution. High growth rates are of interest not only because they are an indication of equipment productivity, but also because under high growth rate conditions the distribution coefficients of constituents of complex solutions approach unity, making it possible to grow layers of uniform composition.

It is an object of my invention to provide an apparatus and a method for the rapid growth of epitaxial layers from solution.

It is an additional object of my invention to provide an apparatus and a method for the growth of epitaxial layers of uniform composition from solution.

Briefly, in accordance with the principles of my invention and in the preferred embodiment thereof, a substrate is introduced to solution in streamline flow through a narrow channel. The solution as it enters the channel is at a temperature, $T_1$, which is above its saturation temperature, $T_s$. The substrate temperature, $T_2$, is held well below $T_s$ by means of coolant flowing across its surface opposite that contacting the flowing solution. Under such conditions, the solution in contact with the substrate becomes supersaturated, and a layer of crystal grows on the substrate.

For purposes of the present invention, a narrow channel has a cross-section with a wide dimension accommodating the substrate and a narrow dimension orthogonal to the substrate, the latter in combination with the length of channel ahead of the substrate in the flow path causing streamline flow in the solution moving in the vicinity of the substrate.

In a particular example, a GaAs substrate at 750° C. with a square surface one centimeter on each side is exposed to a flowing gallium solution containing GaAs. The solution enters the channel with a temperature of 800° C. and with a saturation temperature of 780° C. The channel has a rectangular crossection 1.2 centimeters by one millimeter, and has a length ahead of the substrate of 2.5 centimeters. Growth of GaAs on the substrate takes place at a rate of approximately 10 micrometers per minute.

Further objects, features, and advantages of my invention will become apparent upon consideration of the following detailed description in conjunction with the drawing, in which:

FIG. 6A is a cross-section taken along line 6A—6A of FIG. 6;

FIG. 6B is a cross-section taken along line 6B—6B of FIG. 6A; and

FIG. 6C is a cross-section taken along line 6C—6C of FIG. 6A.

Figure 1:
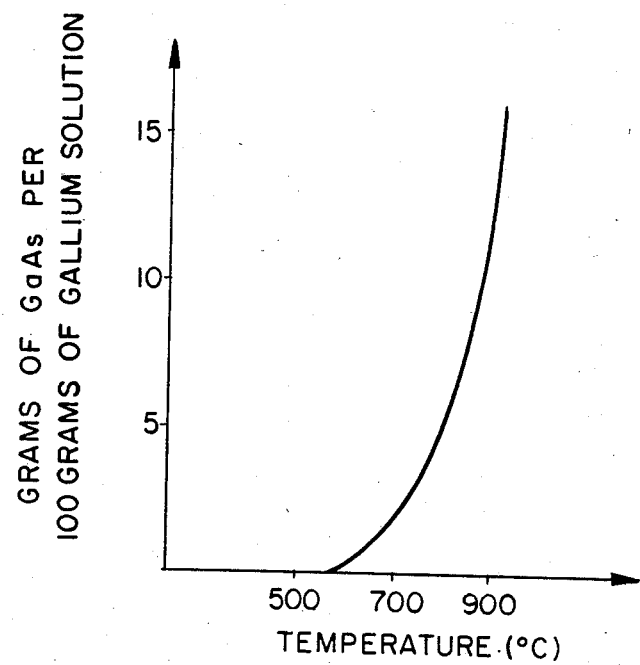
FIG. 1 is a saturation curve for gallium solution containing GaAs.

In FIG. 1, the saturation curve of gallium arsenide in gallium solution is shown. The increase of solute concentration with increase of solution temperature revealed in FIG. 1 is typical of such saturation curves.

Examination of FIG. 1 reveals that under conditions of substantial supersaturation small volumes of solution can supply the solute required to grow thin epitaxial layers on one square centimeter of substrate.

Figure 2:
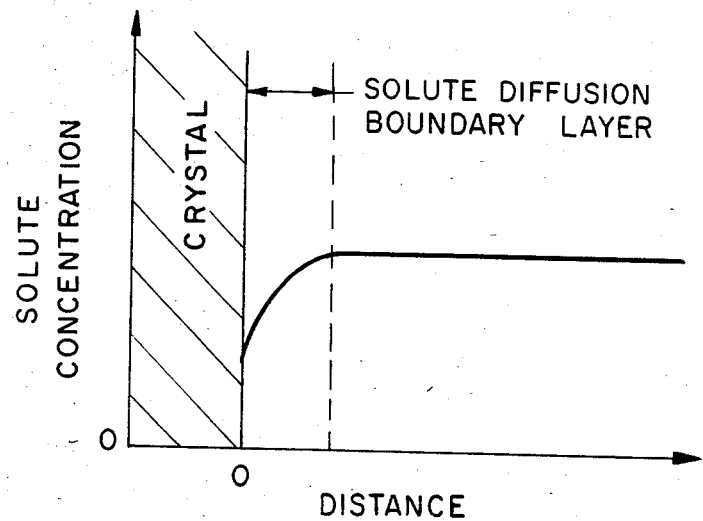
FIG. 2 represents the variation of solute concentration adjacent to a growth interface between a substrate and a solution.

In FIG. 2, the variation in solute concentration in the region adjacent to the growth interface between a crystalline substrate and a solution is shown. FIG. 2 reveals that the solute concentration increases with distance from the interface until a value characteristic of the bulk of the solution is reached.

As the solute concentration increases, so also does the value of the saturation temperature. If the temperature gradient at the growth interface is sufficiently large, nucleation will not occur away from the interface, i.e., constitutional supercooling will be avoided.

Figure 3:
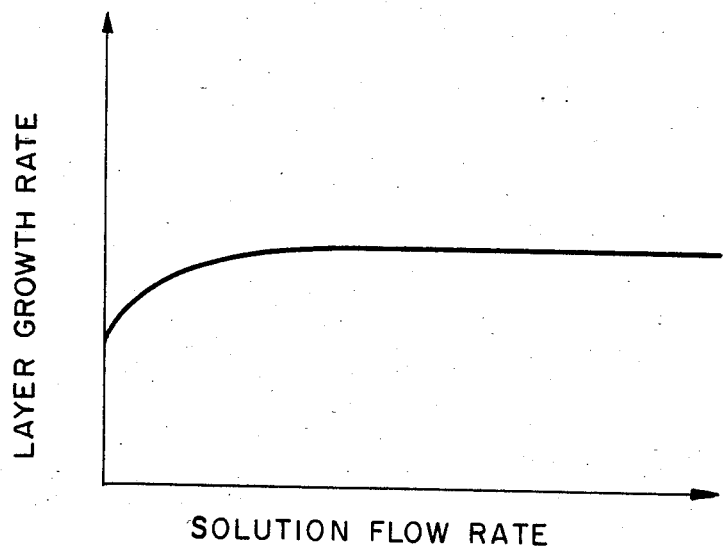
FIG. 3 shows the relationship between layer growth rate and solution flow rate.

In FIG. 3, the variation in layer growth rate as a function of solution flow rate is shown. Layer growth rate increases with solution flow rate until a limiting value is reached. This limiting value is imposed either by heat transfer limitations or by interface kinetic processes.

Figure 4:
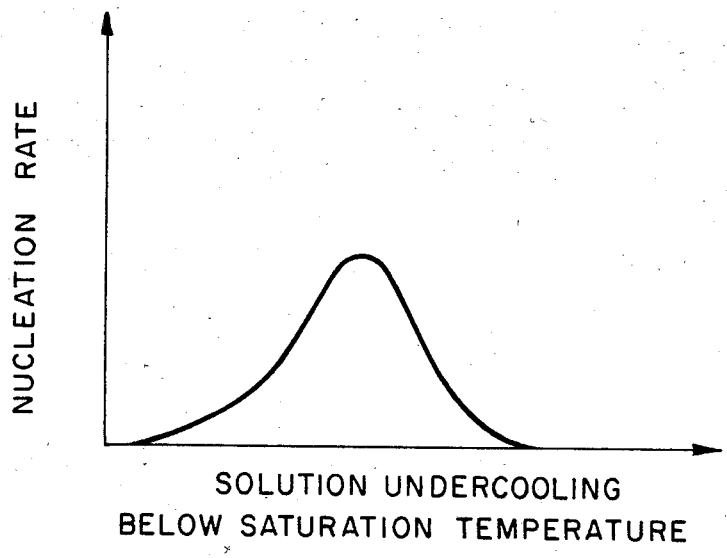
FIG. 4 shows the variation of nucleation rate as a function of solution undercooling below saturation temperature.

In FIG. 4, a curve representing a typical variation of nucleation rate as a function of the undercooling of a solution below its saturation temperature is shown. The fall-off from the maximum is most pronounced for solutions with a large value of viscosity. Metallic solutions, for example, tin or gallium solutions, typically have low values of viscosity, so for metallic solutions the fall-off from the maximum is slow.

As mentioned in connection with FIG. 1, under conditions of substantial supersaturation small volumes of solution can provide the solute required to form thin epitaxial layers on one square centimeter of substrate surface. Thus, for substantially supersaturated solutions in flow across a substrate, slight variations in solute concentration will not of itself cause significant variations in the rate of layer growth as long as uniform temperature conditions exist across the substrate, i.e., as long as free convective currents are suppressed. Such free convective currents will be suppressed if there is streamline flow across the substrate.

When solution is in streamline flow across a substrate, a hydrodynamical stagnant layer of solution will exist adjacent to the substrate surface. When substantial heat is being exchanged between the solution and the substrate, a significant temperature drop will develop across this stagnant layer. A relationship exists between the hydrodynamical stagnant layer and the solute diffusion boundary layer (refer to FIG. 2). As the flow rate of the solution increases, both the hydrodynamical stagnant layer and the solute diffusion boundary layer decrease in thickness. The temperature drop across the former gives rise to a temperature gradient across the latter. When the flow rate is sufficient, constitutional supercooling can thus be avoided while conditions for rapid layer growth are created.

The flow of solution across the substrate also has the advantage of removing from the region of the substrate any material which may nucleate in the body of the solution as a result of fluctuations of conditions in the solution.

To develop streamline flow in a channel, frictional forces introduced at the channel walls must propagate into the bulk of the solution. While it is not essential that such streamline flow propagate fully through the solution flowing across the substrate, it is highly desirable that the solution influencing the solute diffusion boundary layer and heat transfer into the substrate be in streamline flow across the substrate. The length of the channel ahead of the substrate must be sufficient to allow the frictional forces introduced by the walls of the channel to propagate sufficiently into the bulk of the flowing solution for the required streamline flow to develop. The depth that such forces must penetrate is minimized if a narrow channel is used, i.e., if the channel has a cross section with a wide dimension to accommodating the substrate and with a small dimension having a value low enough to assure that streamline flow dominates the motion of solution across and in the vicinity of the substrate. Generally, the value of the Reynold's number for solution flows and channel sizes of interest will be very far below that required for the onset of turbulent flow, which is advantageous since turbulent flow would degrade the quality of the layers grown.

Figure 5:
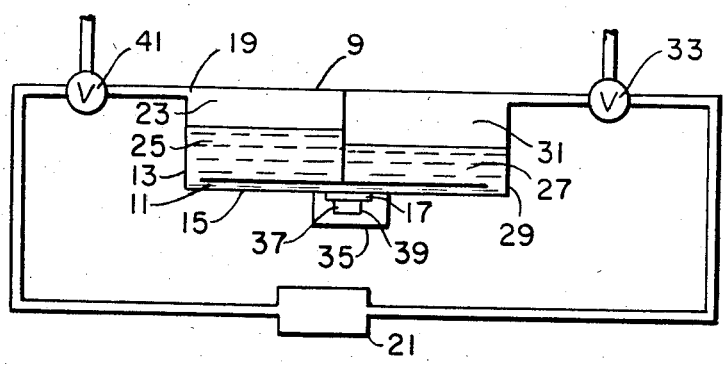
FIG. 5 is a schematic representation in section of an apparatus for layer growth.

In FIG. 5, an apparatus 9 for growth of epitaxial layers is shown schematically. Gas 19 from tank 21 enters space 23 over solution 25 in well 13, thereby causing solution 11 to enter channel 15 and flow across substrate 17. Hydrogen is often a satisfactory gas to use for this purpose, and is available with high purity. After moving through the channel 15, solution 11 enters well 29 and joins solution 27, thereby tending to increase the gas pressure in space 31. The gas pressure in space 31 is relieved when gas leaving space 31 is vented from the apparatus through valve 33.

In order to maintain production capability after some use, it may be desirable to reverse the direction of the flow of solution 11 in the channel 15. In order that this can be done, valves 33 and 41 are implemented in apparatus 9 with second settable positions in which space 31 is connected to tank 21 through valve 33 and space 23 is vented from the apparatus 9 through valve 41.

Substrate 17 is held in slider 35, which moves in a direction perpendicular to the plane of FIG. 5. The substrate 17 is cooled by fluid 37 circulating in conduit 39 of the slider 35. Hydrogen gas is often a satisfactory material to use for the fluid 37. The temperature, $T_2$, of the substrate 17 is well below the saturation temperature, $T_s$, of solution 11 entering channel 15. Preferably, the temperature, $T_1$, of solution 25 and solution 27 is sufficiently greater than $T_s$ as to avoid undesired nucleation of solution in wells 13 and 29.

Channel 15 is a narrow channel with a length ahead of the substrate which is sufficient for the development of streamline flow across the substrate. For narrow channels, this length is normally in the range of 10 to 50 times the small dimension of the channel crossection. For metallic solutions, a satisfactory material of which to fabricate the channel is often graphite, although aluminum oxide and quartz are suitable for many solutions.

When the value of the temperature of solutions 25 and 27 is above the saturation temperature, the solutions 25 and 27 can be used to produce a meltback of the substrate 17 before commencing the growth of a layer by exposing the substrate 17 to flowing solution 11 without cooling it by fluid 37. Such initial meltback tends to aid the quality of the product by removing surface contamination or possibly damaged material.

When layer growth of the desired thickness on the substrate has been obtained, the slider is used to remove the substrate from contact with the solution. At the same time, the substrate is wiped by the apparatus in order to remove any adhering solution and to terminate layer growth.

Apparatus 9 can be heated by its own heat source or can be positioned in an oven. While not shown in FIG. 5, any conventional heat source or oven can be used.

While the apparatus in FIG. 5 has been described in terms of a batch-type operation, continuous operation is possible if a mosaic of substrates is used or a sheet of material is used as a substrate.

The apparatus 45 shown in FIGS. 6, 6A, 6B, and 6C can be placed in the tube of a furnace in order to supply heat needed for its operation. A furnace tube is not shown in FIGS. 6, 6A, 6B, or 6C, but any conventional furnace tube (and furnace) can be used.

In FIG. 6A, wells 65 and 67 are separated by wall 63. When gas enters well 65, the resulting increase in gas pressure causes solution to flow through channel 47, entering via inlet 49 and leaving via outlet 53, to join the solution in well 67. The gas enters well 65 via gas inlet 57, and gas leaves well 67 via gas outlet 59. The solution flowing in channel 47 flows across substrates 51.

Channel 47 has a section between inlet 49 and section outlet 69 and has a section between outlet 53 and section inlet 71 in which the substrates 51 are not in contact with the solution flowing in the channel 47. As was decribed in connection with FIG. 5, the flow in the channel 47 is reversible in order to maintain production capability.

Substrates 51 are advanced into contact with solution flowing through channel 47 when the slider 55 advances (from right to left in FIG. 6A), and are removed from such contact and wiped by the apparatus when the slider 55 again advances. The substrates 51 are cooled by fluid 75 which enters the slider 55 at slider inlet 61 and leaves the slider 55 via slider outlet 77.

In FIGS. 6A and 6B, recess slot 73 is shown. Recess 73 engages the underside of channel 47 except between section outlet 69 and section inlet 71. Fluid 75 flows through conduit 56 of the slider 55. In the vicinity of the substrates 51, conduit 56 is exposed so as to provide a large area of contact between the fluid 75 and the substrates 51 in order to maximize heat transfer and resultant cooling of the substrates by the fluid 75.

Figure 6:
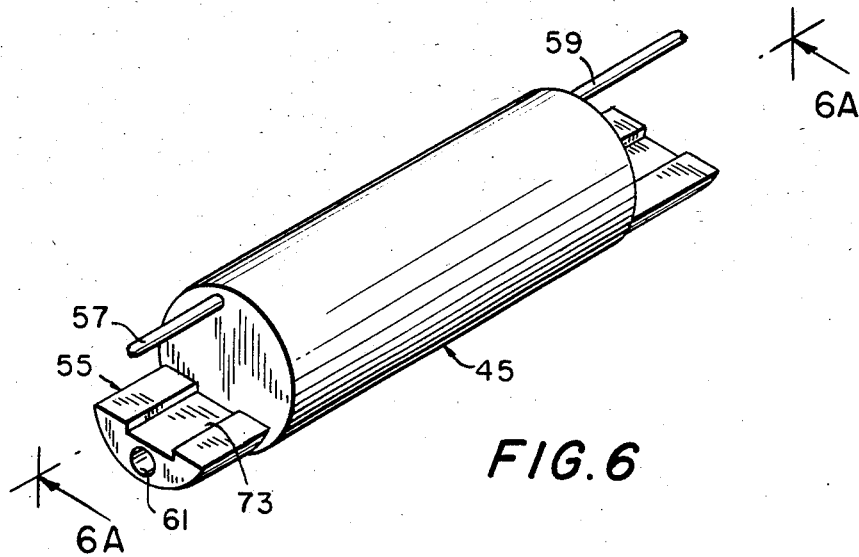
FIG. 6 is a view in perspective of another apparatus for layer growth.

In FIG. 6, a view of apparatus 45 is shown in perspective. The geometric relationship of the slider 55 and the remainder of the apparatus 45 can be seen in FIGS. 6A, 6B, and 6C. The overall configuration is cylindrical in shape, which allows it to be positioned within a tube of a tube furnace. The slider 55 of apparatus 45 moves along the direction of the cylindrical axis of the apparatus 45 so that the apparatus 45 can be operated positioned within a furnace tube. Such an arrangement allows more than one apparatus 45 to be placed in the tubes of a multi-tube furnace, which is advantageous for purposes of production. Such a furnace is not shown, but any conventional tube furnace or multi-tube furnace can be used for such a purpose.

Although the invention has been described with reference to particular embodiments, it is to be understood that these embodiments are merely illustrative of the application of the principles of the invention. Numerous modifications may be made therein and other arrangements may be devised without departing from the spirit and scope of the invention.

I claim:

1. A method of growing an epitaxial layer of a material on a surface of a substrate from a solution, comprising the steps of positioning said surface of the substrate at a first side of a first channel having at the location of said substrate a breadth which is substantially greater than the depth of said first channel, said first channel having an inlet communicating with a reservoir of solution and an outlet communicating with a receiver of solution, forcing at least part of said solution from the reservoir to enter the first channel via said inlet so as to flow through the first channel across said surface of said substrate and to leave the first channel via said outlet and to enter the receiver, said first channel being configured such that streamline flow of said at least part of said solution takes place in the region of said surface of said substrate, causing a coolant fluid to flow in a second channel while in heat exchange relationship with the substrate to lower the temperature of said substrate relative to the saturation temperature of said at least part of said solution entering said first channel, thereby to induce the growth of an epitaxial layer of material on said surface, said growth of said epitaxial layer of said material on said surface of said substrate taking place during said flow of said solution through said first channel.

2. A method of growing material on a surface of a substrate from a solution in accordance with claim 1, wherein said at least part of said solution is forced to flow into, through and out of said first channel and across said surface of said substrate by means of gas pressure on said solution.

* * * * *